(12) United States Patent
Ho

(10) Patent No.: US 6,331,447 B1
(45) Date of Patent: *Dec. 18, 2001

(54) HIGH DENSITY FLIP CHIP BGA

(75) Inventor: Chung W. Ho, Monte Sereno, CA (US)

(73) Assignee: Thin Film Module, Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/838,893

(22) Filed: Apr. 20, 2001

Related U.S. Application Data

(62) Division of application No. 09/332,427, filed on Jun. 14, 1999, now Pat. No. 6,221,693.

(51) Int. Cl.[7] .................................................. H01L 21/48
(52) U.S. Cl. ........................ 438/108; 438/101; 438/26; 438/48; 438/106; 438/1.5; 438/108; 438/118
(58) Field of Search ................................ 438/108, 14, 26, 438/48, 118, 106, 15, 613

(56) References Cited

U.S. PATENT DOCUMENTS

| | | |
|---|---|---|
| 5,485,038 | 1/1996 | Licari et al. .......................... 257/758 |
| 5,509,553 | 4/1996 | Hunter, Jr. et al. ..................... 216/13 |
| 5,525,834 | 6/1996 | Fischer et al. ......................... 257/691 |
| 5,724,232 | 3/1998 | Bhatt et al. ........................... 361/762 |
| 5,830,563 | 11/1998 | Shimoto et al. ....................... 428/209 |
| 5,837,427 | 11/1998 | Hwang et al. ......................... 430/312 |
| 5,877,551 | 3/1999 | Tostado et al. ........................ 257/701 |

*Primary Examiner*—John F. Niebling
*Assistant Examiner*—David A. Zarneke
(74) *Attorney, Agent, or Firm*—George O. Saile; Stephen B. Ackerman

(57) ABSTRACT

A new method is provided for mounting high-density flip chip BGA devices. A dielectric layer is first deposited over the first surface of a metal panel. One or more thin film interconnect layers are created on top of the dielectric layer. The interconnect layers are patterned in succession to create metal interconnect pattern. The BUM technology allows for the creation of a succession of layers over the thin film layers. The BUM layers can be used for power or ground distribution and for signal or fan-out interconnect. A cavity is etched on the second surface of the metal panel. A laser is used to create openings for flip chip pad contacts. The panel is subdivided into individual substrates. The method of the invention can also be applied to Land Grid Array and Pin Grid Array devices.

13 Claims, 4 Drawing Sheets

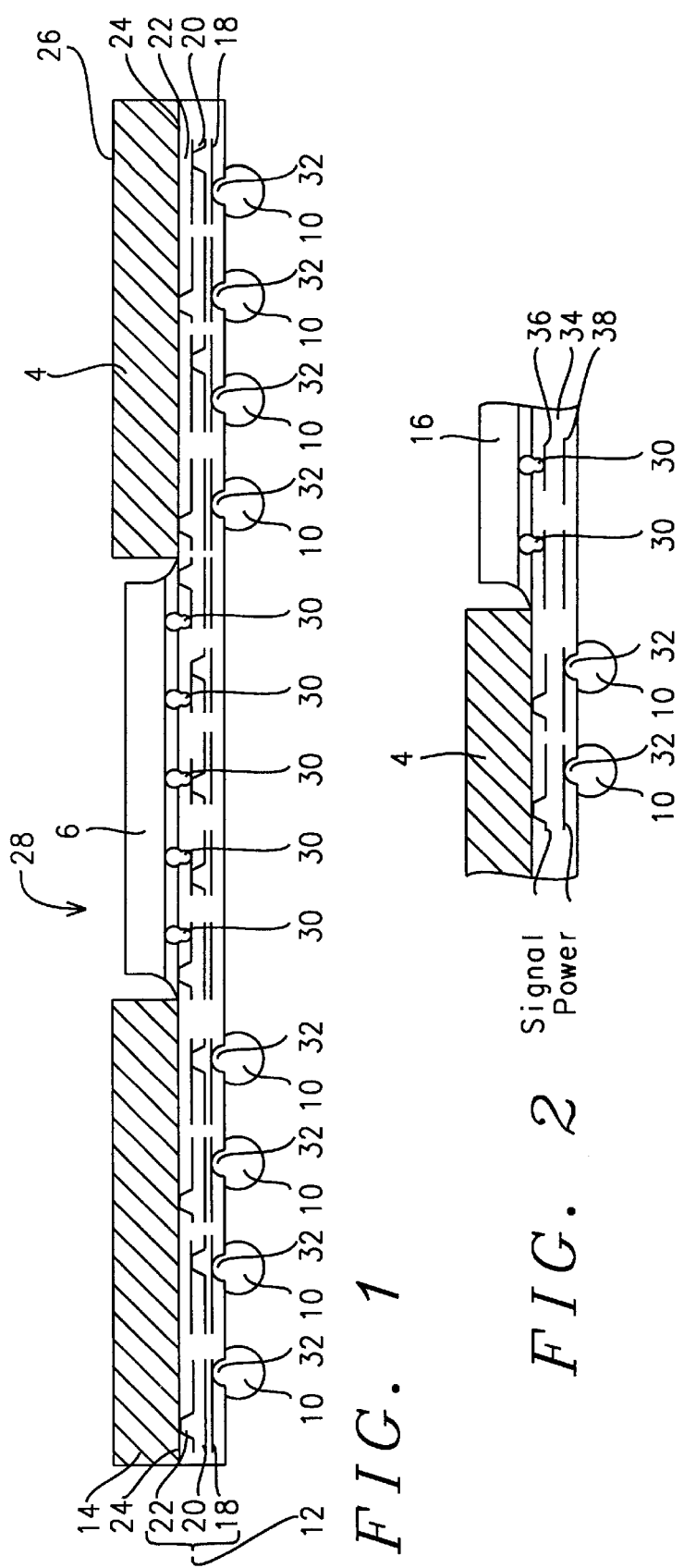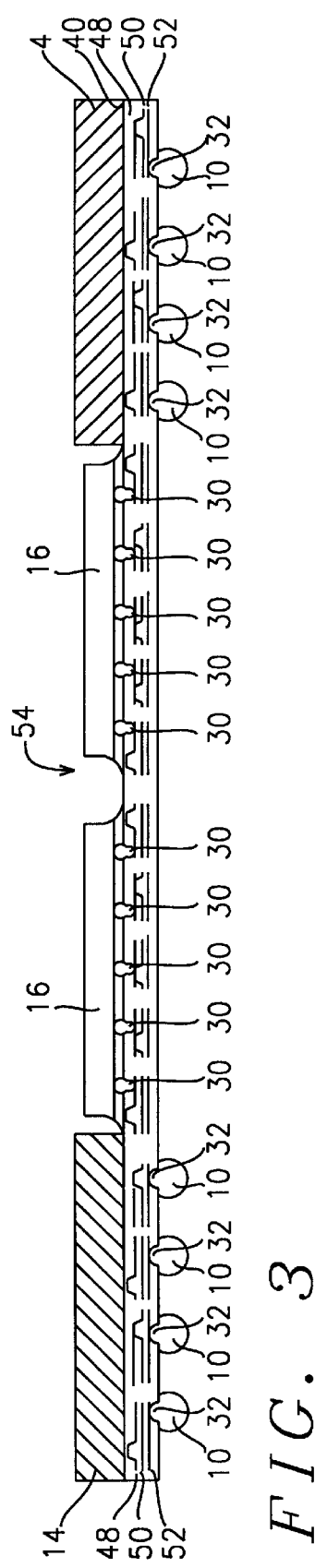

HIGH DENSITY FLIP CHIP BGA

This application is a division of application Ser. No. 09/332,427, filed on Jun. 14, 1999, now U.S. Pat. No. 6,221,693.

This application is related to application Ser. No. 09/332,428, filed on Jun. 14, 1999 now U.S. Pat. No. 6,242,279, assigned to a common assignee.

BACKGROUND OF THE INVENTION (1) Field of the Invention

The invention relates to the fabrication of integrated circuit devices, and more particularly, to a novel process and structure for making packaging substrates for flip chip semiconductor devices.

(2) Description of the Prior Art

When the geometric dimensions of the Integrated Circuits are scaled down, the cost per die is decreased while some aspects of performance are improved. The metal connections which connect the Integrated Circuit to other circuit or system components become of relative more importance and have, with the further miniaturization of the IC, an increasingly negative impact on the circuit performance. The parasitic capacitance and resistance of the metal interconnections increase, which degrades the chip performance significantly. Of most concern in this respect is the voltage drop along the power and ground buses and the RC delay of the critical signal paths. Attempts to reduce the resistance by using wider metal lines result in higher capacitance of these wires.

To solve this problem, the approach has been taken to develop low resistance metal (such as copper) for the wires while low dielectric materials are used in between signal lines.

Increased Input-Output (IO) combined with increased demands for high performance IC's has led to the development of Flip Chip Packages. Flip-chip technology fabricates bumps (typically Pb/Sn solders) on Al pads on chip and interconnect the bumps directly to the package media, which are usually ceramic or plastic based. The flip-chip is bonded face down to the package medium through the shortest path. These technologies can be applied not only to single-chip packaging, but also to higher or integrated levels of packaging in which the packages are larger and to more sophisticated substrates that accommodate several chips to form larger functional units.

The flip-chip technique, using an area array, has the advantage of achieving the highest density of interconnection to the device and a very low inductance interconnection to the package. However, pre-testability, post-bonding visual inspection, and TCE (Temperature Coefficient of Expansion) matching to avoid solder bump fatigue are still challenges. In mounting several packages together, such as surface mounting a ceramic package to a plastic board, the TCE mismatch can cause a large thermal stress on the solder-lead joints that can lead to joint breakage caused by solder fatigue from temperature cycling operations.

The invention teaches a novel process and structure for creating packaging substrates that are used for flip chip semiconductor devices. The packaging substrate is generally used for Ball Grid Array (BGA) packages but can also be used for Land Grid Array (LGA) and Pin Grid Array (PGA) packages.

Prior Art substrate packaging uses ceramic and plastic BGA packaging. Ceramic substrate packaging is expensive and has proven to limit the performance of the overall package. Recent years has seen the emergence of plastic substrate BGA packaging, this type of packaging has become the main stream design and is frequently used in high volume BGA package fabrication. The plastic substrate BGA package performs satisfactorily when used for low-density flip chip Integrated Circuits (IC's). If the number of pins emanating from the IC is high, that is in excess of 350 pins, or if the number of pins coming from the IC is less than 350 but the required overall package size is small (resulting in a solder ball pitch of less than 1.27 $\mu$m.), the plastic BGA structure becomes complicated and expensive. This can be traced to the multi-layer structure used to create the plastic BGA package. This multi-layer structure for the plastic BGA interconnect package is referred to as the Build Up Multi-layer or BUM approach and results in a line density within the package of typically 2–3 mil or 50 u–75 u range. This line density is not sufficiently high for realizing the fan out from the chip I/O to the solder balls on the package within a single layer. This leads to the multi-layer approach. The multi-layer approach brings with it the use of relatively thick (50 u–75 u) dielectric layers, these layers have a Coefficient of Thermal Expansion (CTE) that is considerably higher than the CTE of the laminate board on which the plastic BGA package is mounted. To counteract this difference in CTE's the BUM layers must be (thermally and mechanically) balanced on the other side (the side of the board that does not usually require an interconnect density provided by the BUM layers) of the laminate board. This latter requirement results in the use of additional material and processing steps to apply these materials, increasing the cost of the BGA package and creating a yield detractor.

Other Prior Art applications use thin film interconnect layers for chip or wire bond packaging substrates. These applications start with a laminate substrate onto which the thin film layers are deposited. An example of these thin film applications is the NEC (U.S. Pat. No. 5,830,563) approach. For these applications, the laminate substrate is used as a base carrier substrate and provides the mechanical support. Plated Through Holes (PTH) are mechanically drilled through the laminate substrate and are used to establish connections to the backside of the substrate for solder ball attach and electrical contacts. By using thin films, high wire density and very thin dielectric layers can be realized. This approach also does not, unlike the BUM approach, require to counter-balance thick layers of dielectric in order to establish dimensional stability. A disadvantage of the laminate substrate is that the process of mechanically drilling holes through the laminate substrate is time-consuming adding cost to the process. Further, the planarity of the laminate substrate does not meet planarity requirements for the deposition of thin films. Good planarity for the surface of the laminate substrate is established by depositing dielectrics and metal layers on the initial surface of the laminate structure, steps that again add to the processing cost of the BGA structure. Since the laminate substrate is composed using organic materials, the substrate is not dimensionally stable resulting in warpage and dimensional variations during high temperature processing and wet chemical interactions. This results in additional processing complications and costs.

U.S. Pat. No. 5,509,553 (Hunter, Jr. et al.) shows a (3) metal layer process (DEMR) (see FIG. 5A) that appears to comprise a) sputter plating base b) plating metal (semi-additive plating), see col. 2.

U.S. Pat. No. 5,830,563 (Shimoto et al.) discloses a laminate substrate with thin films deposited thereon.

U.S. Pat. No. 5,837,427 (Hwang et al.) shows a (4) BUM process for a PCB.

U.S. Pat. No. 5,724,232 (Bhatt et al.) shows a package with a (1) metal substrate.

U.S. Pat. No. 5,525,834 (Fischer et al.) shows a package having a Cu substrate, thin dielectric layers (1–25 µm thick) and thin dielectric layers (12 to 75 µm), see col. 7 and 8.

U.S. Pat. No. 5,877,551 (Tostado et al.) discloses a package having a metal substrate with (2) dielectric layers formed of polymers, epoxy (3 to 100 µm), see col. 4.

U.S. Pat. No. 5,485,038 (Licari et al.) teaches a package using a photo-imagable epoxy dielectric layer.

SUMMARY OF THE INVENTION

A principle objective of the invention is to provide an inexpensive and reliable method for high-density flip chip BGA manufacturing.

Another objective of the invention is to reduce performance limitations imposed by Prior Art high-density flip chip BGA manufacturing techniques.

Yet another objective of the invention is to provide for high pin fan-out for flip chip BGA devices.

Yet another objective of the invention is to eliminate the need for counter-balancing the effects of thick layers of dielectric used in conventional high density flip chip BGA device manufacturing.

Yet another objective of the invention is to provide a method of packaging high density flip chip BGA devices by using Build Up Material (BUM) technology in combination with thin film deposition techniques.

Yet another objective of the invention is to provide an initial surface with good planarity for the creation of high-density flip chip BGA structures.

A still further objective of the invention is to provide a structure devoid of warpage and dimensional variations during high temperature or wet chemical processing for the creation of high density flip chip BGA structures.

In accordance with the objectives of the invention a new method is provided for mounting high density flip chip BGA devices. The invention starts with a metal panel on which a dielectric layer is first deposited. A number of thin film interconnect layers are then created on top of the dielectric layer, these interconnect layers can be two or three or more in number. The interconnect layers are patterned in succession to create metal interconnect patterns. The BUM technology allows for the creation of a succession of layers over the thin film layers. Each of the layers created in this manner can be created for a specific function such as power or ground distribution and signal or fan-out interconnect.

BRIEF DESCRIPTION OF THE DRAWINGS

FIG. 1 shows a single chip flip chip package with three interconnect layers.

FIG. 2 shows a single chip flip chip package with two interconnect layers.

FIG. 3 shows a multichip package with three interconnect layers.

DESCRIPTION OF THE PREFERRED EMBODIMENTS

Figure 4:
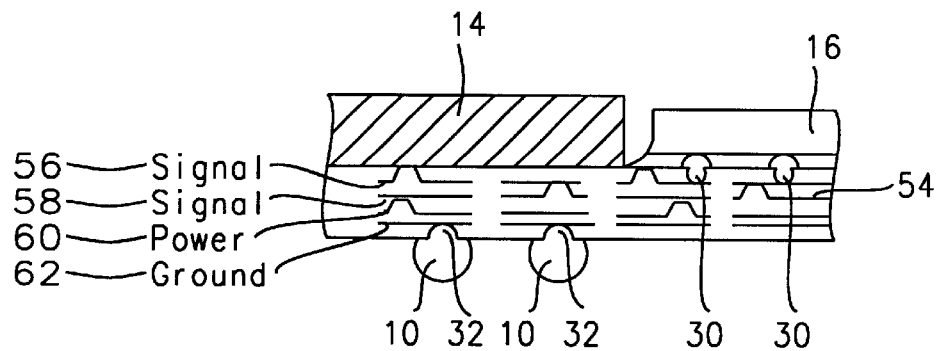
FIG. 4 shows a multichip package with four interconnect layers.

Referring now specifically to FIG. 1, there is shown a cross section of a single chip flip chip with three interconnect layers.

The interconnect substrate 12 contains the totality of the sequence of layers that are created within the scope of the invention for making a high density packaging substrate.

The interconnect substrate 12 has two surfaces. The surface of the interconnect that is in contact with the metal substrate 14 is the second surface of the interconnect substrate, the surface of the interconnect substrate into which the contact balls 10 are mounted is the first surface of the interconnect substrate.

The metal layer within the interconnect substrate 12 that is closest to the first surface 24 of the metal substrate 14 is referred to as the bottom layer, the metal layer within the interconnect substrate 12 that is furthest removed from the first surface 24 of the metal substrate 14 is referred to as the top layer.

The metal substrate 14 has two surfaces, the first surface 24 of the metal substrate is the surface on which the interconnect substrate 12 is created. The second surface 26 of the metal substrate is the surface into which openings are etched for the insertion of BGA chips.

The three interconnect layers within the interconnect substrate 12 are highlighted as 18 (which can be a ground layer), 20 (which can be a power layer) and 22 (which can be a signal layer). Metal substrate 14, typically copper, is about 30 mils thick. The metal used for substrate 14 is not limited to copper but can be other metals such as aluminum or stainless steel. The size of the metal substrate 14 is typically 18×24 inches but the size of the metal substrate 14 is not limited to these dimensions. The invention uses the Build Up Multilayer (BUM) technology (a printed circuit board technology) in combination with thin film deposition technology (a technology used for the creation of flat panels).

It must be noted from FIG. 1 that the metal substrate 14 and the contact balls 10 are mounted on opposite sites of the interconnect substrate 12 while the metal substrate 14 and the contact balls 10 are also aligned with each other (the metal substrate 14 is located above the contact balls 10). The IC 16 is mounted in an opening 28 created in the metal substrate 14. The opening 28 into which the flip chip 16 is mounted is a cavity that is created by masking and etching of the second side 26 of the metal substrate 14.

A dielectric layer (not shown) is first deposited over the metal substrate 14 on the first side 24 of the metal substrate 14 as a first step in the creation of the interconnect substrate 12. This deposition of the dielectric can be done by either lamination or by a coating and curing process. The layer of dielectric typically has a thickness of between about 10 and 40 µm. It a required that the dielectric has a CTE that is higher than the CTE of the metal substrate. This to assure that, after the metal substrate with the deposited layer of dielectric are cooled down to room temperature, the dielectric film is under tension. The dielectric layer can be epoxy with or without a thin glass reinforcement, a polyimide film or any other build-up dielectric material.

Figure 5A:
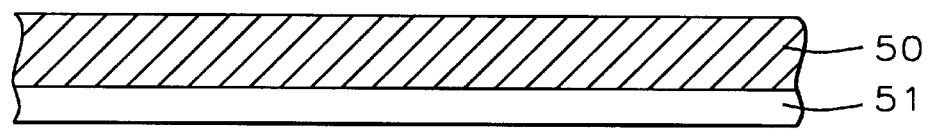
FIG. 5 shows the processing steps used during the thin film deposition process.
Figure 5B:
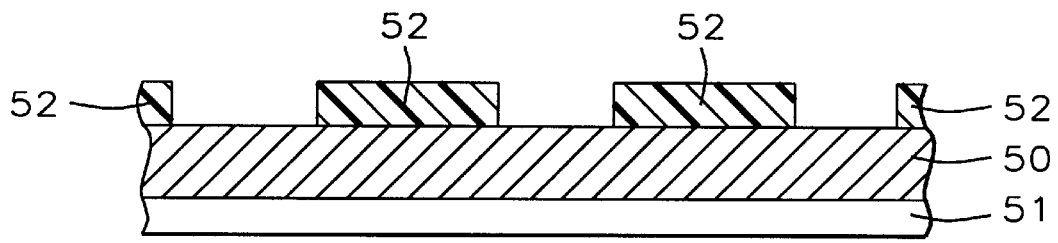
Figure 5C:
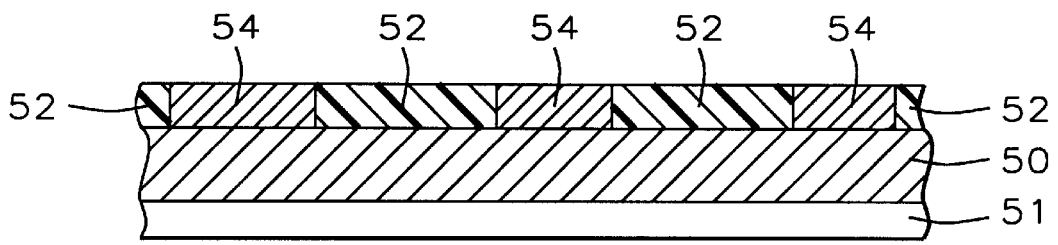
Figure 5D:
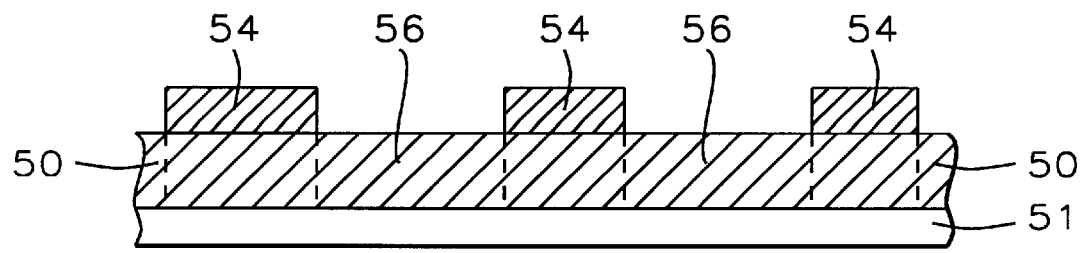
Figure 5E:
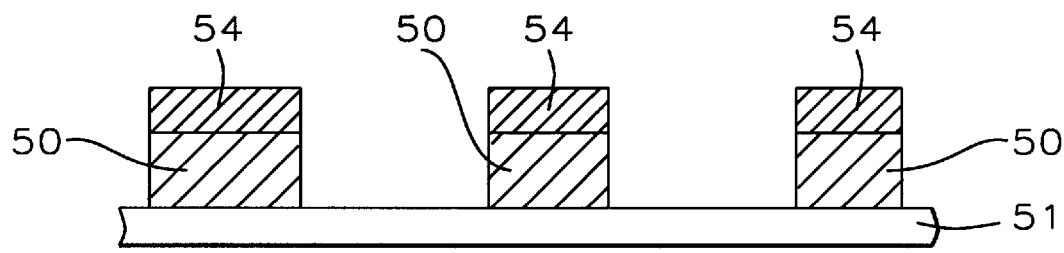
Figure 5F:
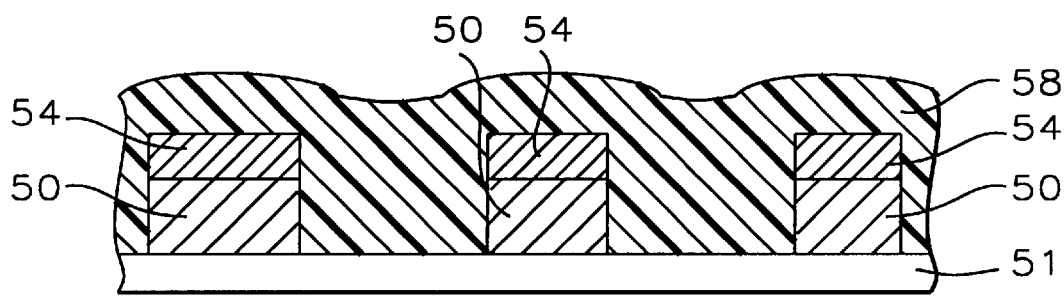

The first step in the creation of the interconnect substrate 12 is the creation of a thin film interconnect metal layer 22 on top of the layer of dielectric. The thin film deposition technique contains the following steps, see FIG. 5:

FIG. 5a, depositing an interconnect plating base 50 by consecutive sputtering of Cr, Au and Cr FIG. 5b, masking and patterning 52 for semi-additive plating of the interconnect pattern;

FIG. 5c, wet etching the thin Cr layer to expose the Au, depositing semi-additive plating 54 of the interconnect pattern by depositing Au, Ni and Cu;

FIG. 5d, removing of the mask 52 (FIG. 5b) for the semi-additive plating of the interconnect pattern;

FIG. 5d, wet etching to remove the sputtered plating base 56, FIG. 5d, from between the interconnect pattern 54;

coating the created interconnect pattern with a layer 58 of dielectric;

for applications where solder connections need to be made to the interconnect pattern the above dielectric forms a solder mask and vias are created in the dielectric for the solder connections.

The state of the art BUM technology provides the technology to add layers 20 and 18 on top of the created thin film interconnect layer 22, these added layers 20 and 18 typically can be for power and ground interconnects but can also be used for fan-out interconnections. Patterns are created in the additional layers 20 and 18, typically for ground and power distribution but not limited to this. The last layer created in this manner, that is the layer 18 in FIG. 1 or the layer furthest removed from the first side 24 of the metal substrate 14, must provide the interconnects with the contact balls of the BGA structure and must therefore be coated as a solder mask.

Figure 6A:
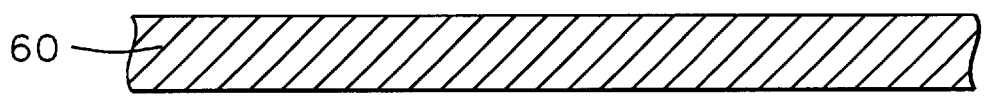
FIG. 6 shows the processing steps used during the BUM process.
Figure 6B:
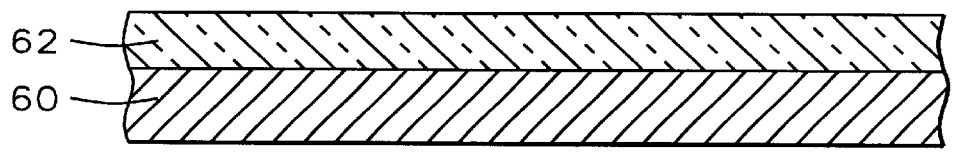
Figure 6C:
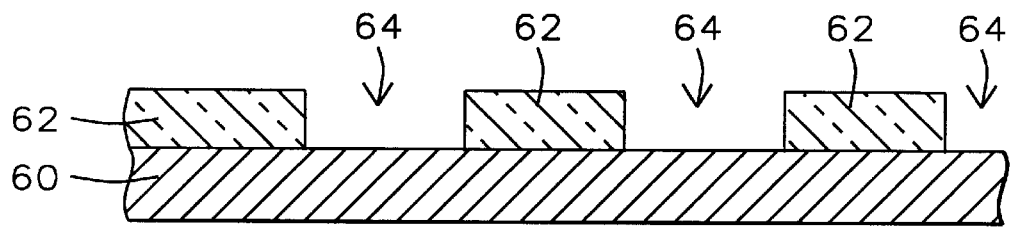
Figure 6D:
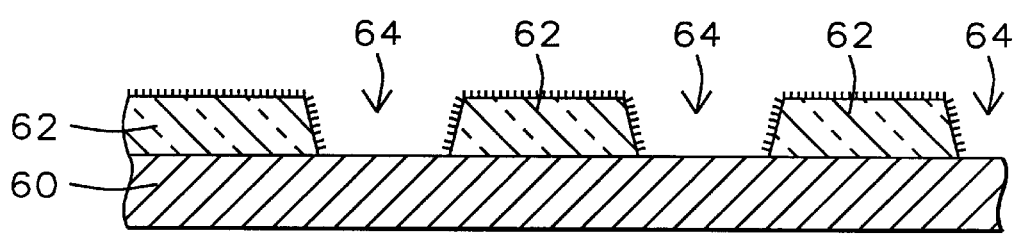
Figure 6E:
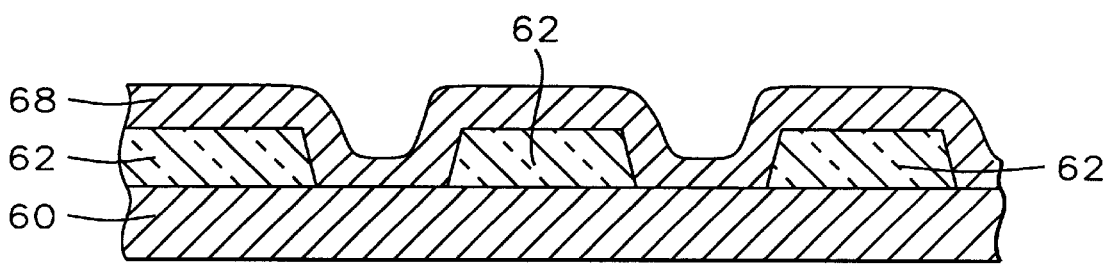
Figure 6F:
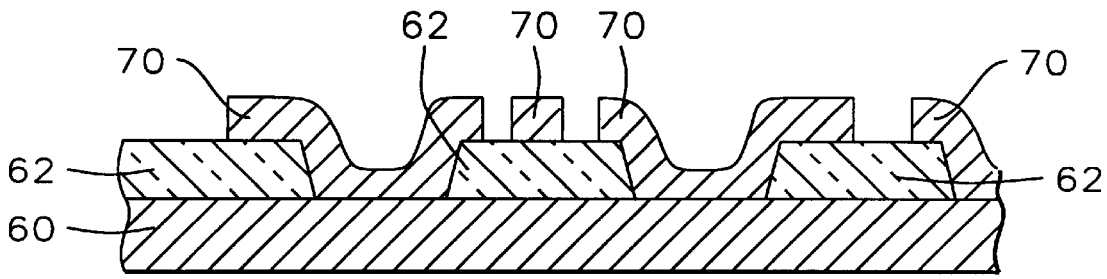

The BUM state of the art technology contains the following processing steps, see FIG. 6:

FIG. 6a, cleaning of the surface of the metal substrate 60;

FIG. 6b, coating of the metal substrate with a dielectric;

FIG. 6c, creating of vias 64 in the dielectric 62 for electrical connections between to the metal substrate 60;

FIG. 6d, etching and swelling of the dielectric 66 to roughen the surface and thereby promote adhesion for the subsequent electroless copper deposition;

FIG. 6d, electroless seeding of the dielectric;

FIG. 6e, plating of the panel with a layer 68 of copper;

FIG. 6f, masking and etching the deposited layer of copper to create the metal pattern 70 in the BUM layer.

The second side 26 of the metal substrate must next be prepared for the mounting of the flip chip; an opening or cavity 28 must therefore be created in the metal substrate 14 that can accommodate the flip chip. The second side 26 of the metal substrate 14 is therefore masked and wet etched to create the opening 28 in the metal substrate 14. The size of this opening can vary and depends on the number of flip chips that are to be mounted on the interconnect substrate 12. The wet etch of the second side 26 of the metal substrate exposes the dielectric layer that has previously been deposited (on the first side 24 of the metal substrate 14, see above). Openings 30 must be created in this layer of dielectric through which the flip chip 16 can be connected to the contact points in the first layer 22. A laser is used to create these openings.

The openings 32 for the BGA solder ball connections are created to expose the top metal pads (the pads in the interconnect layer 12 that are furthest away from the metal substrate 14). The flip chip 16 is inserted into the interconnect layer 12 within the cavity 28, the interconnect layer 12 is brought into contact with the contact balls 10, electrical contact is then established between the flip chip 16 and the contact balls 10.

FIG. 2 shows a cross section of a single chip package where the interconnect substrate 34 contains two interconnect layers 36 and 38. Typically layer 36 will be a thin film interconnect metal layer while layer 38 can be a power layer.

FIG. 3 shows a cross section of a multi-chip structure that contains three interconnect layers in the interconnect substrate. Two flip chips 16 are mounted in a (larger) cavity 54 created within the metal substrate 14. In the example shown in FIG. 3, two thin film interconnect layers 48 and 50 have been created in the interconnect substrate in addition to a BUM power supply layer 52.

FIG. 4 shows a cross section of a multi chip package with four interconnect layers contained within the interconnect substrate. Two thin film interconnect layers 56 and 58 have been created as signal interconnects, layer 60 is a BUM power layer while layer 62 is a BUM ground layer. This interconnect substrate 54 can contain more than one flip chips 16, in accordance with desired design requirements.

Although the preferred embodiment of the present invention has been illustrated, and that form has been described in detail, it will be readily understood by those skilled in the art that various modifications may be made therein without departing from the spirit of the invention or from the scope of the appended claims.

What is claimed is:

1. A method of mounting Ball Grid Array chips comprising:

Providing a metal substrate said metal substrate having a first surface and a second surface;

cleaning of the first surface of said metal substrate;

Depositing a layer of dielectric over said first surface;

Depositing an interconnect layer on top of said dielectric thereby forming the first layer of an interconnect substrate;

Creating a first Build Up Multilayer (BUM) layer over said interconnect layer thereby forming the second layer of an interconnect substrate;

Creating a second Build Up Multilayer (BUM) layer over said first Build Up Multilayer layer thereby forming the third layer of an interconnect substrate;

Coating said second BUM layer as a solder mask;

Exposing the metal pads within said second BUM layer thereby creating openings for BGA solder connections;

Masking and etching said second surface of said metal substrate thereby creating one or more openings for the insertion of said BGA chips thereby furthermore exposing portions of said dielectric within said openings;

Creating openings in said exposed dielectric thereby providing electrical access to said interconnect substrate for said BGA chips; and Subdividing said metal substrate into individual BGA substrates.

2. A method of creating an interface substrate overlying a metal substrate whereby said interface substrate has a first and a second surface, said interface substrate being used for flip chip die attachment, comprising the steps of:

providing a metal substrate whereby said metal substrate has a first and a second surface;

cleaning said first surface of said metal substrate;

depositing a first layer of dielectric over said first surface of said metal substrate;

depositing a metal interconnect layer over the surface of said first layer of dielectric thereby forming a first layer of said interconnect substrate;

depositing a second layer of dielectric over said metal interconnect layer;

creating a via pattern in said second layer of dielectric;

coating said metal interconnect layer with a solder mask;

exposing metal pads within said metal interconnect layer thereby providing points of electrical access to said first surface of said interconnect substrate;

masking and etching said second surface of said metal substrate thereby creating one or more openings is said metal substrate for inserting one or more flip chip semiconductor devices thereby furthermore exposing portions of said first layer of dielectric within said openings;

creating a via pattern in said exposed first layer of dielectric thereby providing electric access to said interconnect substrate for said one or more flip chip semiconductor devices; subdividing said metal substrate into individual substrate units;

inserting one or more flip chips into said opening of said substrate unit whereby the solder balls of said flip chips are re-flowed to and are in contact with said first metal interconnect layer by means of the via pattern in said first layer of dielectric.

3. The method of claim 2 whereby said method is extended to allow for the deposition of a multiplicity of metal interconnect layers whereby each deposition of a metal interconnect layer within said multiplicity of interconnect layers is followed by a deposition of a layer of dielectric over said deposited metal interconnect layer whereby the last deposited metal interconnect layer is coated with a solder mask after which the steps as claimed under claim 2 are to be resumed by exposing metal pads within said last deposited metal interconnect layer said extension to take place immediately after said depositing a first layer of dielectric over said first surface of said metal substrate.

4. The method of claim 2 whereby said exposed metal pads in said solder mask can be attached with solder balls thereby creating said individual substrates as BGA units.

5. The method of claim 2 whereby said exposed metal pads in said solder mask can be coated using Ni/Au thereby using said individual substrates in their completed form as is and applying said individual substrates as LGA's.

6. The method of claim 2 whereby one or more of said interconnect layers comprises a thin film interconnect layer.

7. The method of claim 2 whereby one or more of said interconnect layers comprises a BUM layer.

8. The method of claim 2 whereby said interconnect layer is created applying methods of laminated metal or any other suitable method to create an interconnect layer.

9. The method of claim 2 whereby in addition the exposed via pattern in said exposed first layer of metal interconnect is plated with electrolytic Ni/Au for die attachment.

10. The method of claim 2 whereby in addition the exposed via pattern in said exposed first layer of metal interconnect is plated with electroless Ni/Au for die attachment.

11. The method of claim 2 wherein said thin film interconnect layer is created by sputtering a plating base of a layer of Cr/Cu or Ti/Cu followed by masking said sputtered layer with a semi-additive coating of copper followed by a resist strip and a micro-etch step to remove said sputtered plating base.

12. The method of claim 2 whereby for the application of a first interconnect that comprises a thin film interconnect layer the plating base is created by sputtering Cr/Au/Cr after which the plating base is plated with Ni/Cu for the interconnect whereby after the steps of creating openings in said second surface of said metal substrate and creating said via pattern the exposed Au surface is used for die attachment using solder or wire bond techniques.

13. The method of claim 2 whereby a minimum of one interconnect layer is created forming said interface substrate.

* * * * *